(12) United States Patent
Onishi

(10) Patent No.: US 7,736,912 B2
(45) Date of Patent: Jun. 15, 2010

(54) SEMICONDUCTOR PRODUCTION METHOD AND SEMICONDUCTOR PRODUCTION DEVICE

(75) Inventor: Katsuhiko Onishi, Toyama (JP)

(73) Assignee: Panasonic Corporation, Osaka (JP)

( * ) Notice: Subject to any disclaimer, the term of this patent is extended or adjusted under 35 U.S.C. 154(b) by 26 days.

(21) Appl. No.: 12/180,047

(22) Filed: Jul. 25, 2008

(65) Prior Publication Data

US 2009/0029487 A1    Jan. 29, 2009

(30) Foreign Application Priority Data

Jul. 26, 2007 (JP) ............... 2007-194215

(51) Int. Cl.
*H01L 21/00* (2006.01)
(52) U.S. Cl. ............ 438/5; 438/14; 257/E21.001
(58) Field of Classification Search ............ 438/5, 438/7, 9–11, 14, 16, 17; 257/E21.001
See application file for complete search history.

(56) References Cited

U.S. PATENT DOCUMENTS

| | | | |
|---|---|---|---|
| 6,426,304 B1 * | 7/2002 | Chien et al. ........... | 438/727 |
| 6,440,864 B1 * | 8/2002 | Kropewnicki et al. ...... | 438/710 |
| 7,393,460 B2 * | 7/2008 | Hori et al. ............. | 216/67 |
| 7,439,068 B2 * | 10/2008 | Tatsumi ............... | 436/34 |
| 2005/0019962 A1 | 1/2005 | Tatsumi | |
| 2006/0223317 A1 | 10/2006 | Hori et al. | |

FOREIGN PATENT DOCUMENTS

| | | |
|---|---|---|
| JP | 2001-189302 | 7/2001 |
| JP | 2005-523585 | 8/2005 |
| WO | WO 03/090267 A1 | 10/2003 |

\* cited by examiner

*Primary Examiner*—Jack Chen
(74) *Attorney, Agent, or Firm*—McDermott Will & Emery LLP

(57) ABSTRACT

The objective of the present invention is to prevent the variation in an ashing rate according to a temporal change within an ashing chamber. Then, in order to maintain the ashing rate, the decrease in the number of oxygen atoms in ashing gas within a process chamber 101 is indirectly monitored, and ashing gas, which is equivalent to the decreased number of oxygen atoms, is supplied. As a means to indirectly monitor this decrease amount, the valve travel of an APC valve 130 is monitored, and the decreased ashing gas is estimated, and the ashing gas is supplied.

3 Claims, 7 Drawing Sheets

Fig. 7 converision table of coefficients

| ashing rate (nm/min) | APC valve travel (%) | |
|---|---|---|
| | 16.50~16.60 | 16.60~16.70 |
| 1350~1400 | A=402<br>B=-5262 | A=○○<br>B=○○ |
| 1400~1450 | A=445<br>B=-5932 | A=259<br>B=-2945 |

SEMICONDUCTOR PRODUCTION METHOD AND SEMICONDUCTOR PRODUCTION DEVICE

BACKGROUND OF THE INVENTION

The present invention relates to a production method for a semiconductor device applying a plasma treatment, and a semiconductor production device.

DESCRIPTION OF THE RELATED ART

Recently, in association with high integration, high function and high speed of a semiconductor integrated circuit device, specifications of processing conditions tend to be technically difficult. In the microfabrication process of a semiconductor device, it is routine to use Cu as a wire material. Further, there is a tendency to use a low permittivity film for a wire insulating film. As described above, because Cu and low permittivity film are used for the wire material and an interlayer insulating film, respectively, several problems have occurred when forming the wire.

In other words, it is necessary to remove a resist when forming the wire, at which time ashing is generally accomplished using plasma. However, when ashing, damage and/or oxidization to Cu, damage to a low permittivity film and a permittivity change occur. Consequently, various technologies have been proposed by taking these problems into consideration.

As one of methods to reduce the damage to the low permittivity film, a method where gas containing hydrogen is used when ashing and two steps of ashing are conducted is exemplified. For example, in Japanese Patent Application Laid-Open No. 2005-523585, a method for residual removal where low-bias ashing is conducted in the first step and bias ashing is conducted in the second step is disclosed. Alternatively, in Japanese Patent Application Laid-Open No. 2001-189302, a method where ashing is conducted using gas containing carbon, such as CO, while a base material is protected by C, is disclosed.

SUMMARY OF THE INVENTION

However, if the conventional ashing methods are implemented in the process where Cu is exposed on the surface, Cu disperses from a wafer, and as the number of the treated wafers is increased, the amount of Cu accumulation within a process chamber is increased. With this phenomenon, Cu accumulated within the process chamber reacts with ashing gas and an ashing rates fluctuates.

In the conventional configuration, the ashing time is fixed or an end point is detected by utilizing plasma emission. As the number of treated wafers is increased, Cu is accumulated within the process chamber, and the time period required for the removal of a resist becomes longer. In the case of the fixed time, it is necessary to sufficiently consider the over-ashing time. Further, in the case of detecting the end point, the ashing time becomes longer and a time period where wafers are exposed to plasma becomes longer.

Taking the above-mentioned problems into consideration, the objective of the present invention is to reduce an oxidized Cu amount and damage to a low permittivity film, and to realize stable formation of Cu wires with less variation at last.

In order to accomplish these objectives, the present invention indirectly monitors the reduction in the number of oxygen atoms in ashing gas within a chamber and supplies ashing gas, which is equivalent to the number of decreased oxygen atoms. For example, the decreased amount of ashing gas is estimated by monitoring an APC (auto pressure control) valve used for the pressure control of the chamber, and the ashing gas is supplied.

With this design, variation in the fluctuation of the ashing rate, which fluctuates depending upon the number of treated wafers, can be eliminated; concurrently, the following efficacies are provided:

(1) An oxidized Cu amount can be reduced by optimizing the over-ashing time;

(2) Variation in the ashing time and variation in oxidized Cu amount can be reduced by reducing the variation in the ashing rate; and (3) Damages to insulating films can be reduced by optimizing the over-ashing time.

(4) Variation in the ashing time and variation in damages to insulating films can be reduced by reducing the variation in the ashing rate.

(5) The variations from (1) to (4) are reduced, and as a result, variation in wiring resistance can be reduced.

(6) As the over-ashing becomes shorter, the Cu accumulation amount within the chamber is reduced, and the maintenance cycle becomes longer.

(7) A throughput due to optimization of the ashing time can be improved by the prevention of ashing rate reduction.

BRIEF DESCRIPTION OF THE DRAWINGS

FIG. 7 is a conversion table of coefficients in the second embodiment of the present invention.

DETAILED DESCRIPTION OF PREFERRED EMBODIMENTS

First Embodiment

It is believed that the variation in Cu wiring resistance, which is the above-mentioned problem, occurs in the process where Cu is exposed. As one of the processes where this Cu is exposed, the ashing process is mentioned. The ashing process is described using FIGS. 1A and 1B.

Figure 1A:
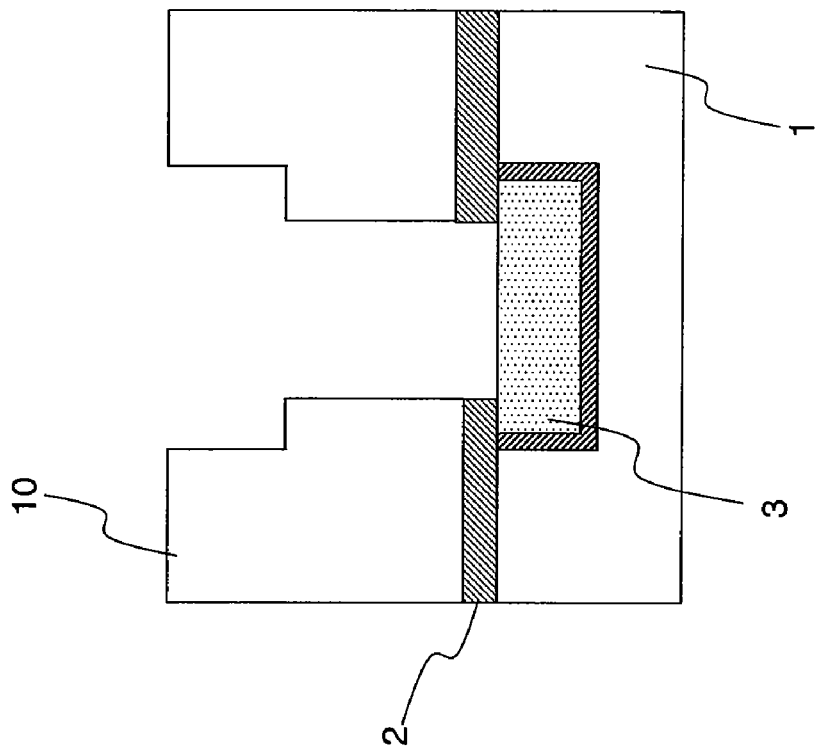
FIGS. 1A and 1B show process cross-sectional views showing a production process of the semiconductor device relating to the present invention.
Figure 1B:
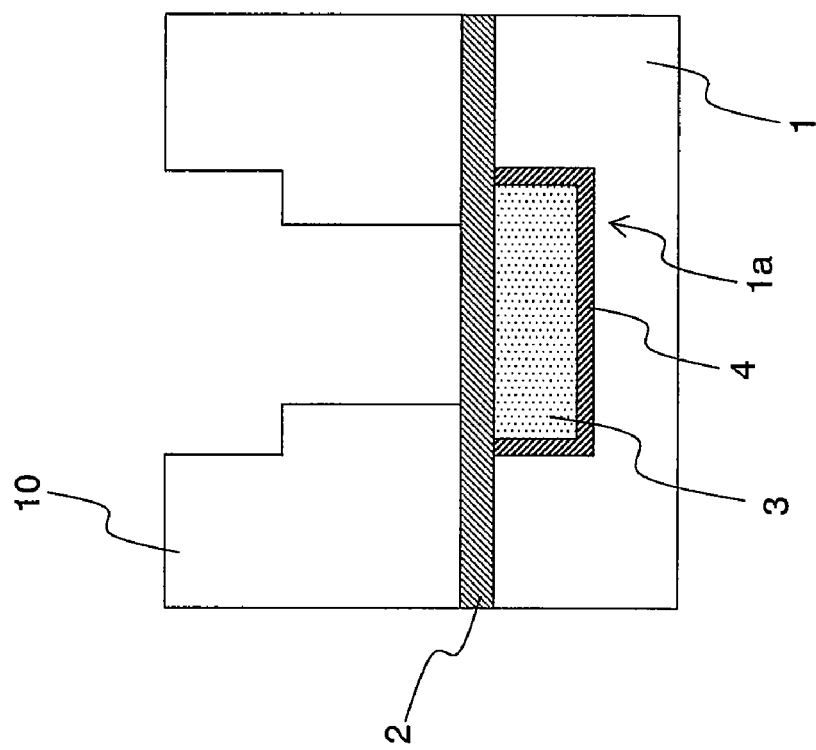

As shown in FIG. 1A, after a groove 1a is formed in a low permittivity film on a substrate, a TaN/Ta film 4, which is a barrier film, a Cu seed layer, which is a wire material, and a Cu film 3 are buried into this groove 1a, and a metal wire is formed by polishing using the CMP (chemical mechanical polishing) method. A stopper film (SiN) 2 covers over the metal wire. In addition, a low permittivity film 10 is formed over the stopper film 2. Then, a wiring groove and a via-hole are formed in the low permittivity film 10. At this time, the stopper film (SiN) 2 is etched, and as shown in FIG. 1B, the Cu film 3 is exposed within the via-hole. Then, ashing is conducted for removing a polymer generally.

Figure 2C:
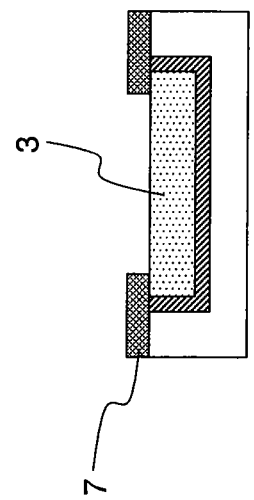
FIGS. 2A, 2B and 2C show process cross-sectional views showing another production process of the semiconductor device relating to the present invention.
Figure 2B:
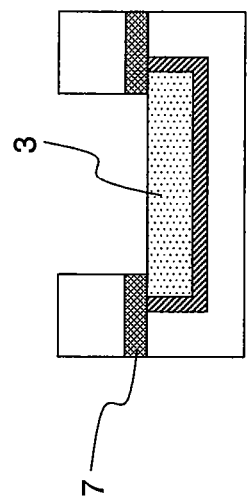

A process to form a pad will be described next with reference to FIGS. 2A, 2B and 2C.

Figure 2A:
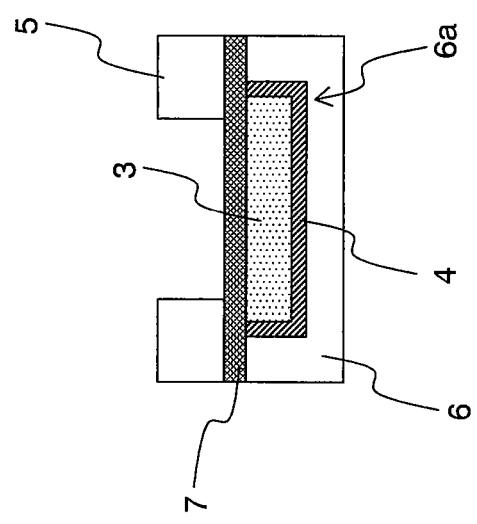

As shown in FIG. 2A, a groove 6a is formed in an insulating film 6; the TaN/Ta film 4 and the Cu film 3, which is a wire material, are buried into this groove 6a; and a pad is formed by polishing using the CMP method. The wire is covered with a pSiN film 7, and patterning is conducted with a resist 5 so as to match the etching part of the pad. Next, as shown in FIG. 2B, the pSiN film 7 is etched. After that, the surface of the Cu film 3 becomes exposed by ashing for resist removal as shown in FIG. 2C.

In the ashing, at least gas containing oxygen atoms, such as $O_2$, Co or $H_2O$, is used as the ashing gas to be introduced into the chamber of the ashing device. Oxygen atoms in this ashing gas react with Cu exposed on the surface of the insulating film. Consequently, within the chamber, the number of oxygen atoms to be contributed to the ashing is decreased. The ashing rate is decreased due to this decrease in the number of oxygen atoms, and the above-mentioned problem occurs.

Figure 3:
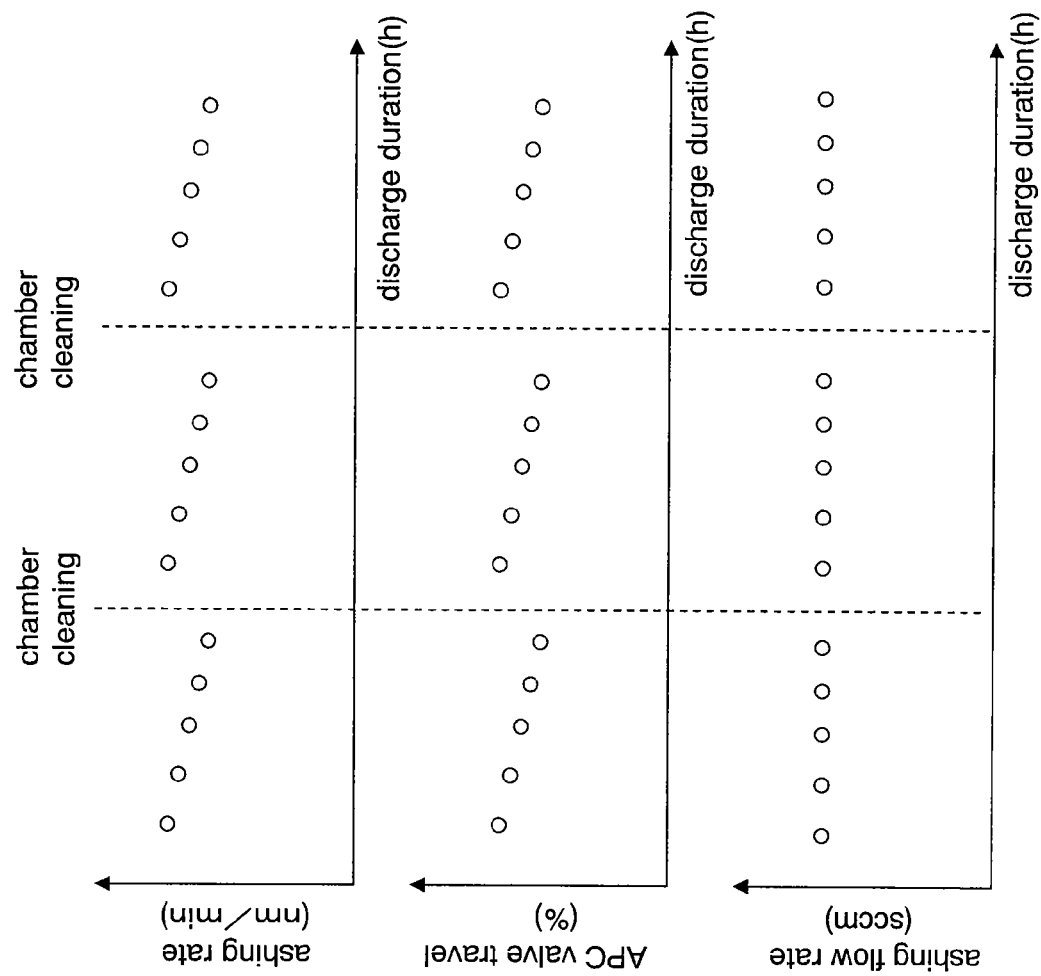
FIG. 3 shows relationship diagrams between the ashing rate, the valve travel and, ashing flow rate, and, discharge duration, respectively.

The decrease can be expressed in the graphs as shown in FIG. 3. The ashing gas flow rate is maintained at constant. The ashing rate is gradually decreased to the chamber cleaning. When the chamber cleaning is conducted, the Cu accumulation within the chamber is eliminated, and the ashing rate is increased to the original one. The APC (auto pressure control) valve travel is also similarly changed, and it is gradually decreased up to the chamber cleaning. When the chamber cleaning is conducted, the Cu accumulation within the chamber is eliminated, and the APC valve travel is increased to the original valve travel.

In order to maintain this ashing rate at constant, the decrease in the number of oxygen atoms in the ashing gas within the chamber is indirectly monitored, and the ashing gas, which is equivalent to the decreased number of oxygen atoms, is supplied.

The first embodiment of the present invention is described hereafter with reference to the drawings.

Figure 4:
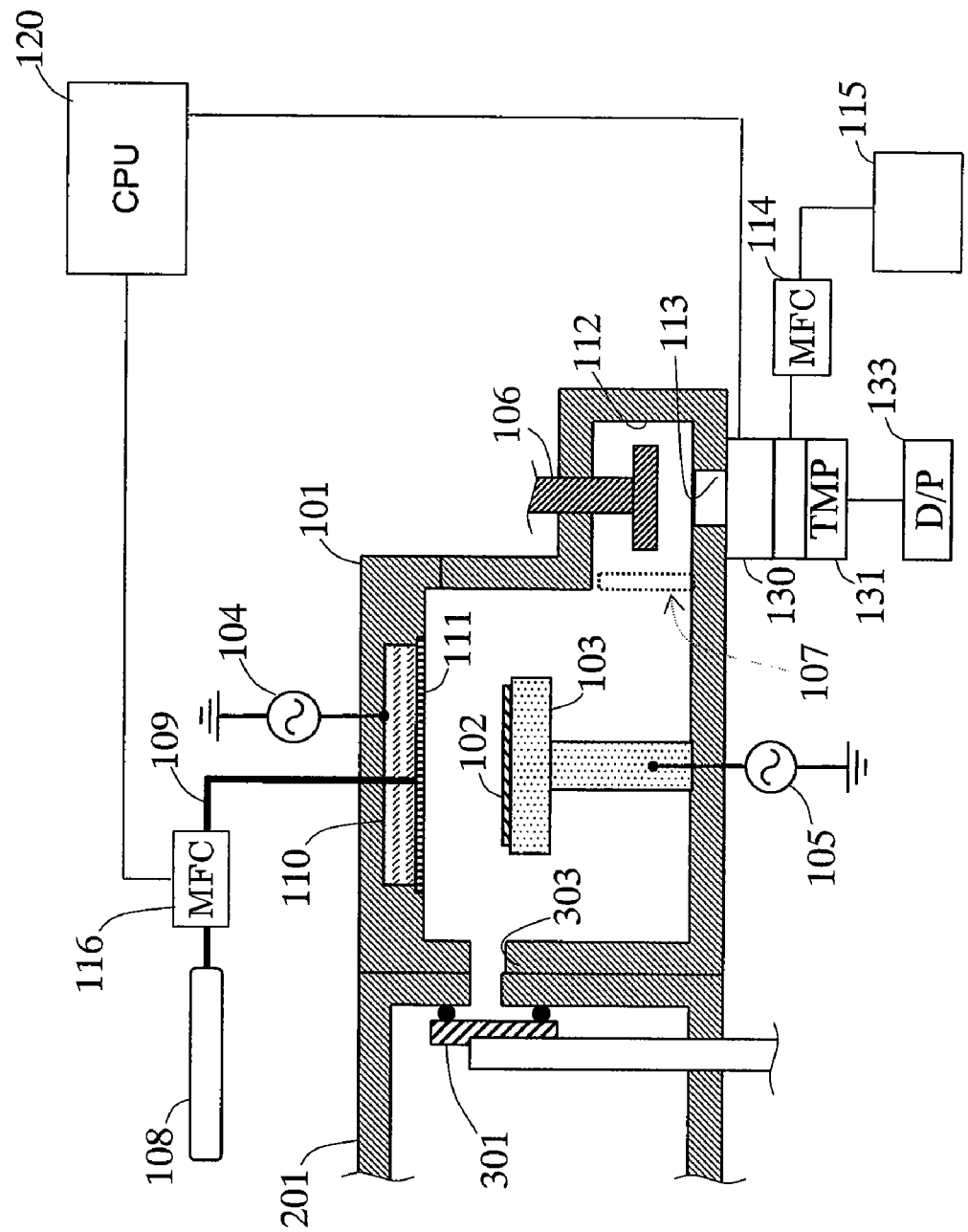
FIG. 4 is a cross sectional view showing a configuration of a plasma treatment device in the present invention.

FIG. 4 is a cross sectional view of the plasma treatment device in the first embodiment of the invention.

A process chamber 101 communicates with a wafer conveyance chamber 201 via a wafer conveyance pathway 303, and a gate valve 301 for opening/closing the wafer conveyance pathway 303 is established so as to block the plasma atmosphere from the process chamber 101.

The wafer conveyance chamber 201 is equipped with a conveyance mechanism (not shown) that carries a wafer 102 into/out of the process chamber 101. The gate valve 301 is established at the side of the wafer conveyance chamber 201.

In the process chamber 101, an upper electrode 110 connected to an upper power source 104 is buried in the top edge; concurrently, a lower power source 105 is connected to a wafer stage 103 for placing the wafer 102, and the wafer stage 103 is configured as a two-cycle type device functioned as a lower electrode.

A gas supply system 109, such as a gas supply source 108, is connected to the process chamber 101 so as to communicate with the upper electrode 110, and gas whose flow rate is controlled by a process gas flow rate controller 116 is discharged from a plurality of holes formed in a gas exhaust plate 111. Further, an exhaust region 112 is established from an exhaust part 107 at the lower side of sidewall facing against the wafer conveyance pathway 303. Then, the exhaust port 113 is formed on the bottom of the exhaust region 112, and an exhaust gate valve 106 that opens/closes the exhaust port 113, a turbo molecular pump that communicates with the exhaust port 113 and a member relating to the exhaust, such as an exhaust pipe, are arranged. Gas within the process chamber 101 is rectified so as to flow through the exhaust part 107, the exhaust region 112 and the exhaust port 113, and exhausted to the outside.

Furthermore, a CPU (central processing unit) 120 that controls each member of this plasma treatment device is shown in FIG. 4. This CPU 120 executes the program, and operates as a monitor means that indirectly monitors a decrease amount of ashing gas, an estimate means that estimates ashing gas, which becomes required according to this decrease amount, and a supply means that supplies ashing as at the flow rate.

The ashing conditions in this embodiment are as follows: pressure: 8.0 Pa, oxygen flow rate: 500 sccm, upper RF power: 3,000 W, lower RF power: 50 W and wafer stage temperature: 25 degrees C.

Figure 5:
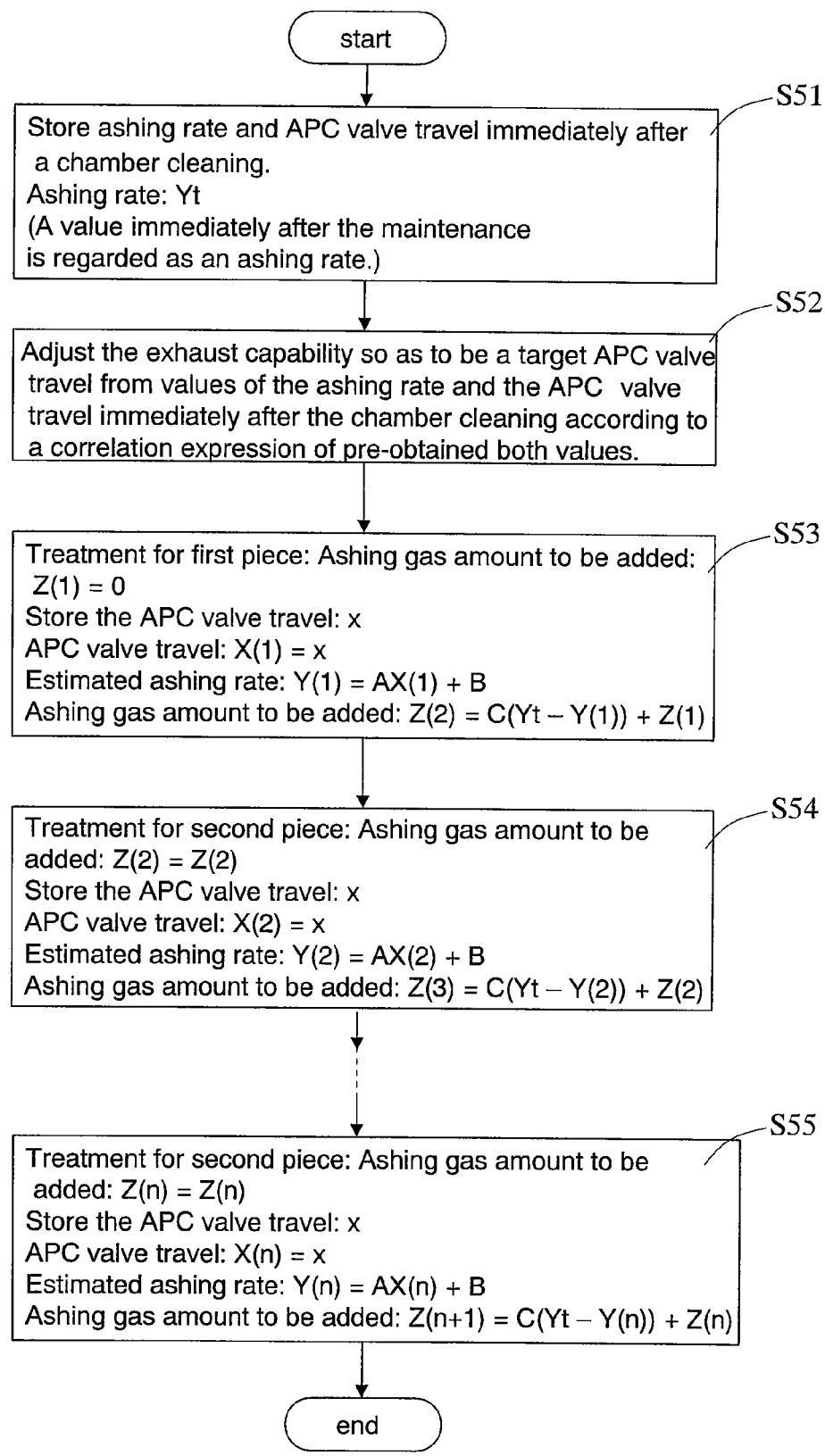
FIG. 5 is a flowchart of the ashing method in the first embodiment of the present invention.

A flow of the ashing method in this embodiment is shown in FIG. 5. At first, a chamber cleaning is completed, and when the condition is ready for ashing treatment, an ashing rate is evaluated. The APC valve travel on that occasion is stored (Step S51 in FIG. 5).

Figure 6:
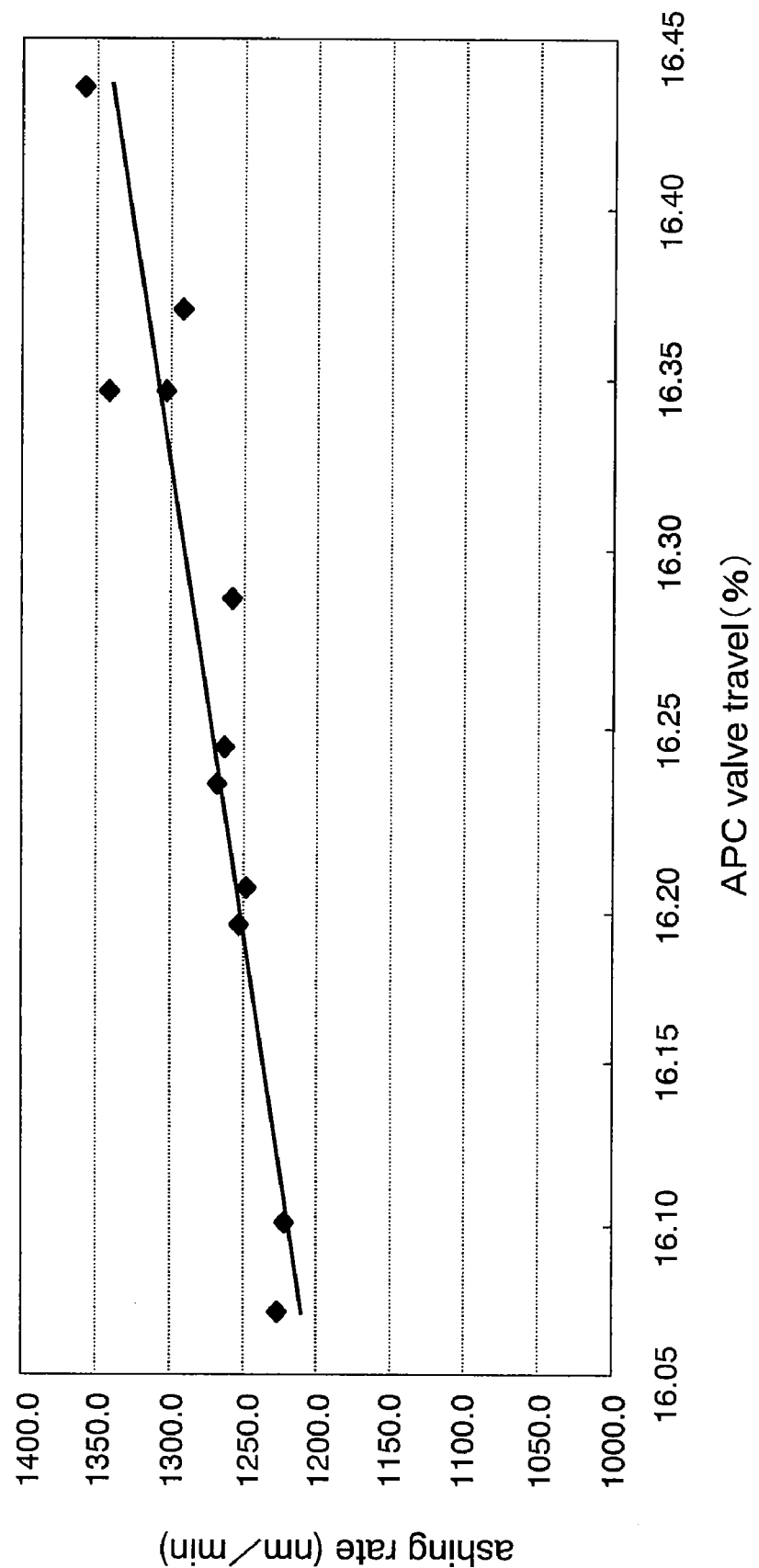
FIG. 6 is a relationship diagram between the APC valve and the ashing rate.

The relationship between the APC valve travel and the ashing rate is shown in the graph of FIG. 6. This relationship is acquired via the experiment conducted under the constant ashing gas environment. Further, this environment was conducted at the same flow rate without changing gas (described below) for adjusting the valve travel of the APC valve 130. If it is presumed that the ashing rate is 1,300 nm/min and the APC valve travel is 17.0%, the relationship between these two conditions shall be greatly deviated from the relationship in this graph. The cause seems to be replacement of components at the time of the chamber cleaning and variation in ultimate vacuum. Consequently, the adjustment shall be conducted so as to approximate this relational expression.

In this embodiment, there is a mechanism to supply gas between the APC valve 130 and the turbo molecular pump 131 shown in FIG. 4, and gas can be supplied from a gas supply source 115 via a gas flow rate controller 114. The APC valve 130 is adjusted so as to enable the adjustment of the gas supply to a target value. Herein, this is adjusted to be 16.32% of the APC valve travel at the time of ashing by supplying the gas (Step S52 in FIG. 5). For the gas, inert gas, such as $N_2$, is used. Herein, although the APC valve travel is adjusted by supplying the gas, the APC valve travel may be adjusted by controlling the exhaust capability using another means. For example, a valve is established between the turbo molecular pump 131 and a dry pump 133 and conductance is changed, and the valve travel of the APC valve may be adjusted to a target value.

Further, an ashing rate immediately after maintenance is represented by Yt, and this value is set as the target ashing rate.

As shown in FIG. 5, when treating a first product, the ashing gas amount (oxygen, herein) to be added: $z(1)=0$ sccm. Then, the APC valve travel x during the treatment is stored. When $X(1)=x$, an estimated ashing rate is calculated herein. The estimate ashing rate is: $Y(1)=A \times X(1)+B$. The coefficients A and B herein can be acquired from the relationship as shown in FIG. 6, which was obtained from the experiment in advance.

Then, an adding ashing gas amount: $Z(2)=C \times (Yt-Y(1))+Z(1)$, which is required when treating a second product, is calculated (S53 in FIG. 5). In the case of conditions herein, as the coefficient C calculated from the experiment result, C=2.0 sccm/(nm/min) is used.

When treating a second product, the ashing gas amount: Z (2) to be added, which was previously acquired, is added, and an ashing treatment is conducted. As similar to the previous one, the APC valve travel x is stored, and when X (2)=x, the estimate ashing rate: Y (2)=A×X (2)+B is calculated. Then, the ashing gas amount Z (3)=C×(Yt−Y (2))+Z (2) required to be added when processing a third product is calculated (Step S54 of FIG. 5).

This process is repeated. When processing an $n^{th}$ product, the ashing gas amount: Z (n) is added to the previously added amount obtained, and the ashing treatment is conducted. As similar to the previous one, the APC valve travel x is stored and when X (n)=x, the estimate ashing rate: Y (n)=A×X (n)+B is calculated. Then, the ashing gas amount: Z (n+1)=C× (Yt−Y (n))+Z (n) required to be added when treating an $(n+1)^{th}$ product is calculated (Step S55 of FIG. 5).

Further, if the ashing rate is substantially constant, the ashing time can be secured. An over ashing time is calculated in advance according to the experiment if necessary, and the over ashing time is added. The method to detect the end point by monitoring the plasma emission is adoptable; however, the ashing time becomes substantially constant.

With this process, the variation in the ashing rate, which occurs due to Cu within the chamber, can be reduced.

Further, it is possible that a facility may greatly fluctuate the APC valve travel due to some abnormality. On that occasion, there is a possibility to supply an abnormal ashing gas amount to a next wafer. When the absolute value: Z(n+1)−Z (n) is a certain value or greater, it is desirable to set the interlock not to treat the next wafer. Further, basically, Z(n+1)−Z(n) is a positive value.

Herein, for the processing apparatus, a two-cycle one is used; however, even with one with another plasma source, such as microwave, it is possible to use this ashing method.

Second Embodiment

In the First Embodiment, the process to adjust the APC valve travel was inserted after the chamber cleaning; however, this can be omitted. There is another method where many experiment data of the APC valve travel and the ashing rate are collected in advance, and the coefficients A and B are calculated from the APC valve travel and the ashing rate after the chamber cleaning.

The values of A and B are obtained in advance within the assumed range, for example, when the APC valve travel is 16.50% to 16.60% and the ashing rate is 1,400 to 1,450 nm/min, A=○○ and B=○○, (FIG. 7).

Then, the coefficients A and B are calculated from the APC valve travel and the ashing rate after the chamber cleaning.

With this process, it becomes unnecessary to adjust the APC valve travel per chamber cleaning.

Third Embodiment

In general, the ashing rate fluctuates according to the temperature within the chamber. A temperature sensor is buried into the sidewall of the chamber, and the accuracy of the ashing rate estimate is improved using the temperature. However, this is effective only when there is correlation between the ashing rate and the temperature sensor value. Instead of the estimated ashing rate expression used in the First Embodiment, the expression mentioned below is used. In other words, the estimated ashing rate: Y (n)=A×X(n)+B−D×(T (chamber temperature)−E) is used. Herein, the coefficients D and E are obtained from an experiment. Further, the chamber temperature T is an actually-measured value.

With this process, the variation in the ashing rate occurred due to the variation in the chamber temperature can be reduced.

As described above, the present invention is effective for the reduction of the variation in the ashing rate, which is one factor of the variation in the Cu wiring resistance in the semiconductor production. Further, from the viewpoint of productivity, this ashing method is useful, for example, a waste of ashing time can be eliminated.

What is claimed is:

1. A production method for a semiconductor device comprising an ashing step for ashing a semiconductor substrate where a metal wire is exposed on the surface of an insulating film, comprising:
 a monitoring step to indirectly monitor a decrease amount of ashing gas to react with a resist during the ashing process; and
 a supplying process to supply ashing gas according to the decrease amount.

2. The production method for a semiconductor device according to claim 1, wherein gas containing oxygen atoms is used as the ashing gas.

3. The production method for a semiconductor device according to claim 1, wherein in the monitoring step, the decrease amount is indirectly monitored based upon a valve travel of an auto pressure control valve to be used for pressure control of a chamber.

* * * * *